(12) United States Patent
Yamada

(10) Patent No.: US 8,952,270 B2
(45) Date of Patent: Feb. 10, 2015

(54) MULTILAYER WIRING BOARD HAVING LANDS WITH TAPERED SIDE SURFACES

(75) Inventor: Tomoko Yamada, Nagano (JP)

(73) Assignee: Shinko Electric Industries, Co., Ltd, Nagano-shi (JP)

( * ) Notice: Subject to any disclaimer, the term of this patent is extended or adjusted under 35 U.S.C. 154(b) by 356 days.

(21) Appl. No.: 12/975,703

(22) Filed: Dec. 22, 2010

(65) Prior Publication Data
US 2011/0155442 A1 Jun. 30, 2011

(30) Foreign Application Priority Data

Dec. 25, 2009 (JP) ................. 2009-294435

(51) Int. Cl.
*H05K 1/11* (2006.01)
*H01L 23/498* (2006.01)
*H05K 3/46* (2006.01)

(52) U.S. Cl.
CPC .......... *H05K 1/116* (2013.01); *H01L 23/49822* (2013.01); *H05K 3/4682* (2013.01); *H05K 2201/0352* (2013.01); *H05K 2201/094* (2013.01); *H05K 2201/09827* (2013.01); *H01L 2224/16227* (2013.01); *H01L 2924/15311* (2013.01); *H01L 2224/16225* (2013.01)
USPC ...................................... 174/266

(58) Field of Classification Search
CPC ......... H05K 1/11; H05K 1/111; H05K 1/112; H05K 1/113; H05K 1/114; H05K 1/115; H05K 1/116; H05K 3/4038; H05K 3/403; H05K 3/42; H05K 3/421; H05K 3/422; H05K 3/423; H05K 3/425
USPC .......... 174/266, 250, 255, 261, 262, 264, 265
See application file for complete search history.

(56) References Cited

U.S. PATENT DOCUMENTS

| | | | | |
|---|---|---|---|---|
| 5,199,163 | A * | 4/1993 | Ehrenberg et al. | 29/830 |
| 6,240,636 | B1 * | 6/2001 | Asai et al. | 29/852 |
| 6,326,561 | B1 * | 12/2001 | Watanabe et al. | 174/264 |
| 7,500,306 | B2 * | 3/2009 | Carpenter et al. | 29/830 |
| 2007/0271783 | A1 * | 11/2007 | Ikeda | 29/852 |
| 2010/0109052 | A1 * | 5/2010 | Nakajima et al. | 257/197 |

FOREIGN PATENT DOCUMENTS

| | | |
|---|---|---|
| JP | 2003-158379 A1 | 5/2003 |
| JP | 2005-72328 A1 | 3/2005 |

* cited by examiner

*Primary Examiner* — Tremesha S Willis
(74) *Attorney, Agent, or Firm* — Kratz, Quintos & Hanson, LLP

(57) ABSTRACT

A multilayer wiring board has a structure in which vias are formed on an inner wiring layer in directions toward both surfaces of the inner wiring layer, respectively, and lands are each defined in the inner wiring layer at a position to be connected to one of the vias, each of the lands having a side surface formed in a tapered shape. The lands include first lands and second lands, and the vias include a via connected to a surface on a smaller diameter side of the first land, and a via connected only to a surface on a larger diameter side of the second land. The size of the surface of the larger diameter side of the second land is equal to the size of the surface of the smaller diameter side of the first land.

4 Claims, 3 Drawing Sheets

CASE WHERE VIAS ARE FORMED ON BOTH SIDES OF LAND ( D=Ds1 )

CASE WHERE VIA IS FORMED ON SMALLER DIAMETER SIDE OF LAND ( D=Ds2 )

CASE WHERE VIA IS FORMED ON LARGER DIAMETER SIDE OF LAND ( D=Db3 )

⇩ CHANGE OF LAND SIZE ( D=Ds3 )

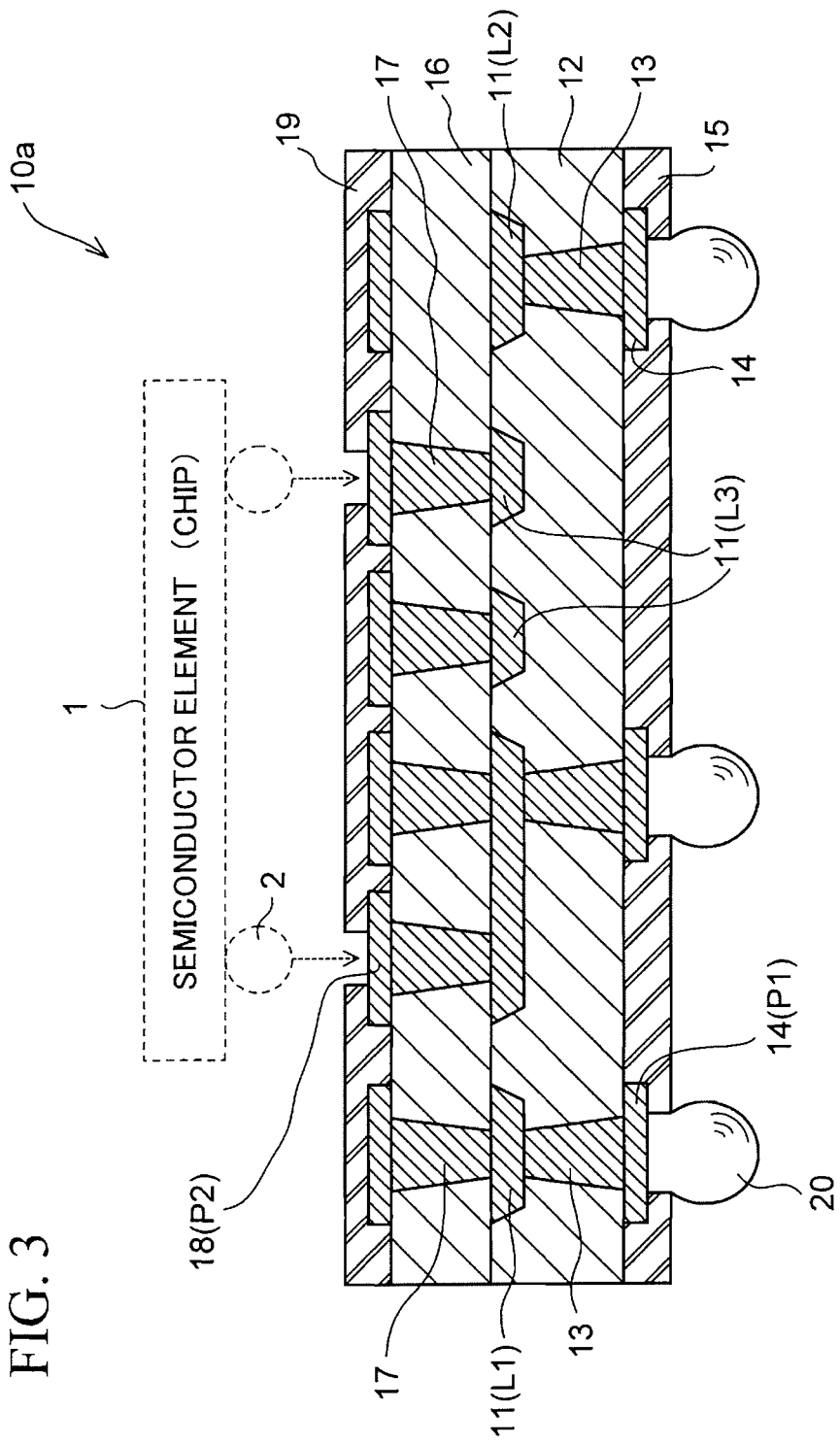

MULTILAYER WIRING BOARD HAVING LANDS WITH TAPERED SIDE SURFACES

CROSS-REFERENCE TO RELATED APPLICATION

This application is based upon and claims the benefit of priority of the prior Japanese Patent Application No. 2009-294435, filed on Dec. 25, 2009, the entire contents of which are incorporated herein by reference.

FIELD

The embodiment discussed herein is related to a multilayer wiring board. More specifically, it relates to a multilayer wiring board having a structure in which vias are formed on an inner wiring layer in directions toward both surfaces of the wiring layer, respectively, and a land defined in the wiring layer at a position connected to each of the vias is formed to have a tapered side surface.

Such a multilayer wiring board is also referred to as a "semiconductor package" or simply "package" in the following description for the sake of convenience in that the wiring board has a role as a package on which a semiconductor element or the like is mounted.

BACKGROUND

In a package having a structure in which insulating layers (e.g., resin layers) are formed respectively on top and bottom sides of an inner wiring layer, and in which interlayer connection vias are formed in the resin layers, lands (or pads) each required for ensuring conduction with the vias are arranged in the inner wiring layer. The size of each of the lands is designed, regardless of the cross-sectional shape of the land, on the basis of a value calculated in consideration of the size of a via to be connected thereto, variations in formation position of the via, variations in formation position of the land and the like.

In addition, where a laser is used to form the vias, the processing output (laser output), or the number of shots needs to be changed for changing the diameter of the laser via. Further, a resin residue (smear) remains in the via hole opened by the laser processing. Thus, uniformity may be decreased in desmearing to remove the resin residue or in plating to be performed thereafter. For this reason, it has been a general practice in the conventional art to use vias having the same diameter at least for the same wiring layer and then to use the lands with the same size.

As an example of the technique related to the conventional art, there is a multilayer wiring board described in Patent document 1 (Japanese Laid-open Patent Publication No. 2005-72328). As another technique, there is a multilayer wiring board described in Patent document 2 (Japanese Laid-open Patent Publication No. 2003-158379).

The size of a land as described above is preferably made as large as possible for the purpose of ensuring connection reliability with the via. On the other side, for the purpose of increasing the wiring density, the size of the land needs to be made as small as possible so that the increased portion of the wiring layer can be used as a region used to form a normal wiring pattern.

Where a wiring is formed by subtractive method, a slope in accordance with the thickness of the wiring is formed on the side surface of the wiring (side surface of the land) during etching. Namely, the land is formed in a tapered shape. Accordingly, there occurs a difference in size between the upper surface and the lower surface of the land.

Where vias are formed on an inner wiring layer in directions toward both surfaces of the wiring layer, respectively, the land sizes required respectively for the upper and lower surfaces of the wiring may be the same if the land is used for vias with the same diameter. However, where the lands are uniformly designed with the same size regardless of the directions in which the corresponding vias are connected, there occurs a problem. Specifically, for the purpose of ensuring the connection reliability, the smaller one of the lower and upper surface sizes needs to be set as the lower limit of the sizes. As a result, there occurs a problem in that the size of the opposite side surface of the land becomes excessively (unnecessarily) large.

Where a land is provided in an unnecessarily large size, the region of the wiring layer that can be used as the region used to form a wiring pattern is reduced by the unnecessary amount of the land. This leads to a decrease in the wiring density. Moreover, the decrease in the region usable for wiring may lead to a need to set finer wiring rules, or to increase the number of wiring layers, thus causing a difficulty in manufacturing.

SUMMARY

According to one aspect of the invention, there is provided a multilayer wiring board including an inner wiring layer, vias formed on the inner wiring layer in directions toward both surfaces of the inner wiring layer, respectively, and lands each defined in the inner wiring layer at a position to be connected to one of the vias, each of the lands having a side surface formed in a tapered shape, wherein the lands include first lands and second lands, and the vias include a via connected to a surface on a smaller diameter side of the first land, and a via connected only to a surface on a larger diameter side of the second land, and wherein the size of the surface of the larger diameter side of the second land is equal to the size of the surface of the smaller diameter side of the first land.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a cross-sectional view illustrating a configuration of a multilayer wiring board (package) according to another embodiment.

DESCRIPTION OF EMBODIMENTS

A preferred embodiment of the present invention will be explained with reference to the accompanying drawings.

Figure 1:
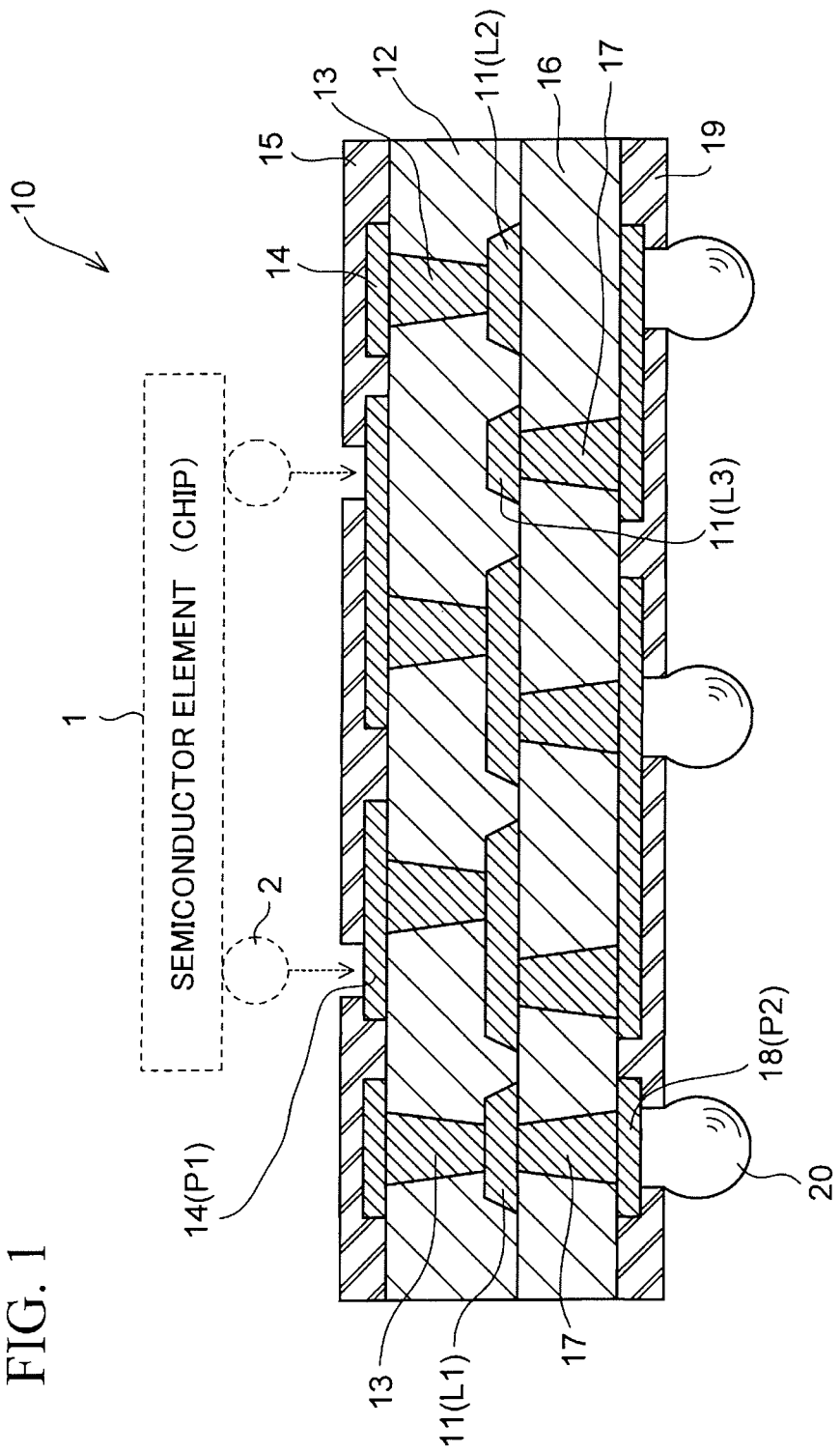
FIG. 1 is a cross-sectional view illustrating a configuration of a multilayer wiring board (package) according to an embodiment.

FIG. 1 illustrates a configuration of a multilayer wiring board (package) according to an embodiment, in a cross-sectional view.

The multilayer wiring board (package) 10 according to the embodiment has a basic structure in which multiple wiring layers 11, 14 and 18 are stacked one on top of another with insulating layers 12 and 16 each interposed between corresponding wiring layers, and the wiring layers are interlayer-connected through conductors (vias 13 and 17) used to fill in via holes formed in the insulating layers 12 and 16. In this embodiment, a structure formed of the three wiring layers is used for the sake of simplicity of illustration. Among the three wiring layers, the wiring layer 11 located in the middle of the wiring layers forms an "inner wiring layer" and the other wiring layers 14 and 18 each form an "outermost wiring layer."

Specifically, the package 10 has a form called a "coreless substrate," which has no support base member like a multi-layer wiring board fabricated by using a general build-up process (fabricated by alternatively stacking insulating layers and wiring layers one on top of another on both surfaces of a core substrate serving as a support base member). The coreless substrate is advantageous in that the substrate can be made thinner, but the rigidity of the entire package is low since the substrate has no support base member.

For this reason, as a way to reinforce the package 10, a prepreg (e.g., a bonding sheet in a semicured B stage, formed by impregnating a thermosetting resin such as an epoxy-based resin or a polyimide-based resin into glass cloth that is a reinforcement material) is used as the primary material of the insulating layers 12 and 16 for increasing the strength of the structure. In addition, the wiring layer 11 in the middle of the wiring layers is formed with a large thickness as compared with the other wiring layers 14 and 18.

Solder resist layers (insulating layers) 15 and 19 each serving as a protection film are formed on both surfaces of the package 10 so as to cover the surfaces of the outermost wiring layers 14 and 18, respectively, while exposing the portions of pads P1 and P2 defined at required positions of the outermost wiring layers 14 and 18. To the pads P1 exposed from the solder resist layer 15 on one surface side (top side in the illustrated example), electrode terminals 2 of a semiconductor element (chip) 1 as illustrated by broken lines are flip-chip bonded through conductive members such as solder bumps.

To the pads P2 exposed from the solder resist layer 19 on the surface side opposite to the chip mounting surface, solder balls 20 (external connection terminals) for use in mounting the package 10 on a mounting board such as a motherboard are bonded. Instead of the solder balls 20, pins made of metal (such as kovar, for example) may be bonded to the pads P2. Moreover, such external connection terminals are not necessarily bonded to the pads P2, and the pads P2 may be kept exposed so as to allow the external connection terminals to be connected later thereto when necessary. Alternatively, an LGA (land grid array) form in which the pads P2 themselves are configured to function as the external connection terminals may be employed as well.

The multilayer wiring board (package) 10 of the embodiment has a structure in which the vias 13 and the vias 17 are formed on both surface of the inner wiring layer 11 in directions toward both surfaces of the wiring layer, respectively, and lands L1, L2 and L3 connected to the vias 13 and 17 are defined on the wiring layer 11. In addition, the wiring layer 11 (lands L1, L2 and L3) is formed so as to have a tapered side surface (trapezoidal shape when viewed in a cross-sectional view) in this structure. Each of the lands L1, L2 and L3 defined on the wiring layer 11 has a circular shape when viewed in a plane view. Each of the vias 13 provided in the insulating layer 12 and the vias 17 provided in the insulating layer 16 has a circular shape when viewed in a plan view, and the side surface thereof has a tapered shape as illustrated.

In the structure of the multilayer wiring board 10 of the embodiment, the direction in which the vias 13 are formed in the insulating layer 12 and the direction in which the vias 17 are formed in the insulating layer 16 are opposite to each other on the wiring layer 11 positioned in the middle of the wiring layers. Specifically, the multilayer wiring board 10 of the embodiment is obtained by sequentially forming the insulating layers 12 and 16, the vias 13 and 17, and the wiring layers 14 and 18 on both surfaces of the inner wiring layer 11 while placing the wiring layer 11 at the center, instead of alternately stacking insulating layers and wiring layers one on top of another from one surface of the substrate toward the other surface thereof. Although a specific exemplary method is described later, the basic process involves forming a structure including the wiring layer 11, the insulating layer 12, the vias 13, the wiring layer 14 and the solder resist layer 15, first, then, sequentially forming the insulating layer 16, the vias 17, the wiring layer 18 and the solder resist layer 19 on the surface side of this structure where the wiring layer 11 is formed, and thereafter, bonding the solder balls 20 to the structure eventually.

The size (example) of each of the component members in this package 10 is described below. To begin with, the thickness of the inner wiring layer 11 is selected to be approximately, 20 to 30 µm, while the thickness of the other wiring layers 14 and 18 is selected to be approximately 18 µm. In addition, the thickness of the insulating layers 12 and 16 is selected to be approximately 40 µm. In addition, a diameter of the larger diameter side of each of the lands L1, L2 and L3 is selected to be approximately 150 µm, and a diameter of the smaller diameter side thereof is selected to be approximately 140 µm. Moreover, a diameter of the larger diameter side of each of the vias 13 and 17 is selected to be approximately 70 µm, and a diameter of the smaller diameter side thereof is selected to be approximately 60 µm.

Figure 2A:
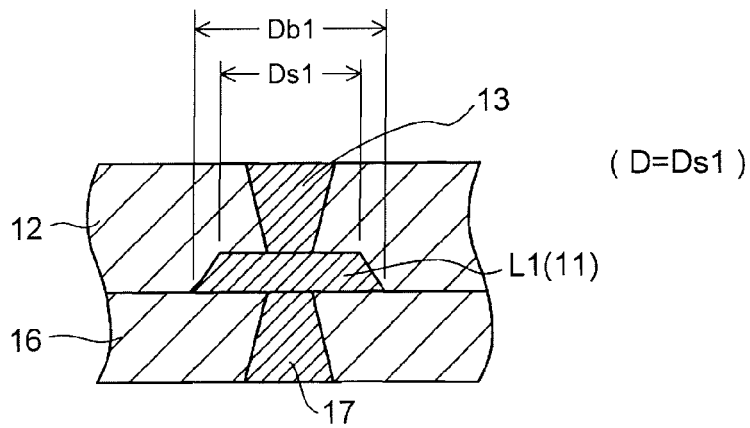
FIGS. 2A to 2C are diagrams illustrating the relationship between the directions in which vias are provided in the multilayer wiring board of FIG. 1 and the sizes of lands to which the vias are connected.
Figure 2B:
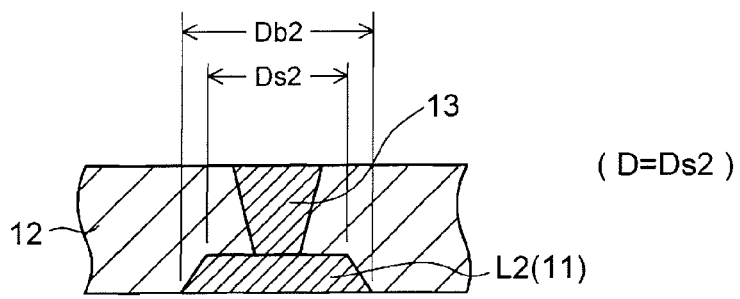
Figure 2C:
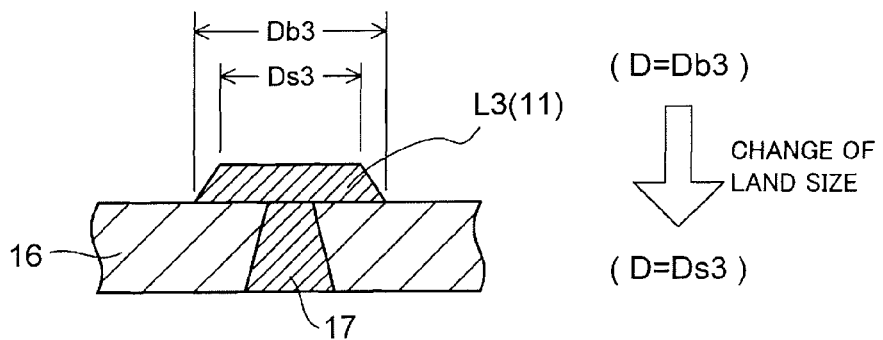

FIGS. 2A to 2C illustrate the relationship between the directions in which the vias 13 and 17 to be provided in the package 10 of the embodiment are formed, and the sizes of the lands L1, L2 and L3 to which the vias 13 and 17 are connected.

As illustrated, the sizes of surfaces on a larger area side (land diameters of larger diameter side) of the lands L1, L2 and L3 each formed with a tapered side surface as illustrated are set to be Db1, Db2 and Db3, respectively. In addition, the sizes of surfaces on a smaller area side (land diameters of smaller diameter side) of the lands L1, L2 and L3 are set to be Ds1, Ds2 and Ds3, respectively. In this embodiment, each of the lands L1, L2 and L3 has the same area. Specifically, the land diameters of the larger diameter side and the smaller diameter side are selected to be: Db1=Db2=Db3 and Ds1=Ds2=Ds3, respectively. In addition, the size of the land diameter required for forming a via on the land is set to D.

In this embodiment, when a land diameter (=D) required for connecting the vias on the inner wiring layer 11 (wiring layer on which the vias 13 and 17 are formed in directions toward both surfaces of the wiring layer, respectively) is to be determined, the land size is appropriately changed in such a way that the required land diameter (=D) becomes equal to the land diameter of the smaller diameter side of the land. Specifically, the minimum required size for connecting the vias is set to be the land diameter (=D) for ensuring the connection reliability of the vias.

Whether or not to change the land size is determined depending on the direction in which the via is connected to the land (i.e., whether the via is connected only to the surface of the land on the larger diameter side or on the smaller diameter side, or to both surfaces of the land). Among the lands L1, L2 and L3, the land to which the via is connected at a surface on the smaller diameter side is referred to as a "first land," while the land to which the via is connected only at a surface on the larger diameter side is referred to as a "second land." Hereinafter, description is further given with reference to FIGS. 2A to 2C.

FIG. 2A illustrates a case where the vias 13 and 17 are formed respectively on both surfaces of the land L1 (case of first land). In this case, the via 13 is connected to the smaller diameter side surface of the land L1, and the via 17 is connected to the larger diameter side surface thereof. In this connection structure, the land diameter (=D) required for forming the vias 13 and 17 on the land L1 has to be matched to the land diameter Ds1 of the smaller diameter side. Thus, the land size is not changed. In other words, the size of the land L1 is set as illustrated (larger diameter side is set to Db1, smaller diameter side set to Ds1).

FIG. 2B illustrates a case where the via 13 is formed only on the smaller diameter side surface of the land L2 (case of first land). In this connection structure, the land diameter (=D) required for forming the via 13 on the land L2 is matched to the land diameter Ds2 of the smaller diameter side as illustrated. Thus, the land size is not changed. In other words, the size of the land L2 is set as illustrated (larger diameter side is set to Db2, smaller diameter side set to Ds2).

FIG. 2C illustrates a case where the via 17 is formed only on the larger diameter side surface of the land L3 (second land) (case of second land). In this connection structure, the land diameter Ds3 of the smaller diameter side (=Ds1, Ds2), which is the minimum required size for connecting the via 17, is sufficient as the land diameter (=D) required for forming the via 17 on the land L3. Specifically, if the size of the surface to which the via 17 is connected is set to be the land diameter Db3 of the larger diameter side as illustrated, the amount of region corresponding to the difference between the Db3 and the land diameter required for connecting the via 17 (D=Ds3) is used wastefully. In other words, the wasted region can be otherwise used as a region used to form wiring.

Accordingly, in the case of the aforementioned connection structure, the land size is changed (D=Db3 to Ds3). As a result, the size (area) of the land L3 is reduced. Specifically, the size of the larger diameter side to which the via 17 is connected is reduced to the Ds3 (=Ds1, Ds2), and the size on the opposite side (smaller diameter side) is also reduced from the illustrated Ds3 by a ratio in accordance with the taper shape.

Thus the land sizes of the first lands L1 and L2 and the second land L3 to be formed on the same inner wiring layer 11 are configured to be reduced appropriately in accordance with the directions in which the vias 13 and 17 connected to the lands are formed. Incidentally, with the conventional art, the sizes of the lands on the same wiring layer are uniformly designed as described above, so that there is a useless portion in the land sizes.

The multilayer wiring board (package) 10 according to the embodiment can be fabricated in the manner described below, for example.

First, a copper (Cu) support base member is prepared as a temporary substrate. As the form of the support base member, a copper plate or copper foil is basically sufficient. As a specific example, the form (structure obtained by arranging an underlying layer and a copper foil on a prepreg and then heating and pressurizing the underlying layer and copper foil on the prepreg) disclosed in the technique (Japanese Laid-open Patent Publication No. 2007-158174) previously proposed by the applicant of this description can be used.

Next, the inner wiring layer 11 (FIG. 1) patterned in a required shape is formed on the support base member by a subtractive method using a photoresist. The wiring layer 11 is patterned and formed in such a way that the first lands L1 and L2 and the second land L3 are defined at predetermined multiple positions. During this processing, a portion of the side surface of the wiring pattern on the front surface side is in contact with an etching solution for a long time as compared with a portion of the side surface on the support base member side. As a result, the portion of the side surface of the wiring pattern on the front surface side is easily etched away. Thus, the cross-sectional shape of the pattern becomes a trapezoidal shape. Specifically, the side surface of the wiring layer 11 (lands L1, L2 and L3) is formed in a taper shape.

Here, during the patterning, as described in relation with FIG. 2C, among the lands L1, L2 and L3 to be formed on the wiring layer 11, the land L3 (second land) to which the via 17 is connected only at the surface on the larger diameter side is patterned into a shape obtained by reducing the land size.

Next, after removal of the aforementioned photoresist, the insulating layer 12 is formed on the surface of the support base member where the wiring layer 11 is formed. As the material of the insulating layer 12, a prepreg is preferably used for the purpose of reinforcing the package 10 as described above. The required insulating layer 12 can be formed by laminating this prepreg onto the support base member and the wiring layer 11, and then curing the prepreg by a hot press at a temperature of 130 to 200° C.

Next, via holes are formed at required positions of the insulating layer 12 (portions corresponding to the lands L1 and L2 formed on the wiring layer 11) by use of a carbon dioxide laser, excimer laser or the like. Thereafter, the vias 13 are formed by filling the via holes with a conductive paste or the like and then curing the conductive paste. Further, the wiring layer (Cu) 14 of a required pattern connected to the vias 13 is formed on the insulating layer 12. For example, a semi-additive method or the like can be used to form the wiring layer 14. In addition, filling of the via holes with conductor can be performed simultaneously with the formation of the wiring layer. Moreover, the wiring layers and insulating layers may be alternatively stacked one on top of another as appropriate to achieve a further increase in the number of layers in the structure.

Next, the solder resist layer 15 is formed so as to cover the front surface of the outermost wiring layer 14 while exposing the portions of the pads P1 defined at the required positions of the wiring layer 14. Since the electrode terminals 2 of the semiconductor element 1 are connected, via solder bumps or the like, to the pads P1 exposed from the solder resist 15 in a later process, Au plating is applied to the pads P1 for increasing the contact properties. During this process, Ni plating is applied to the pads (Cu) P1 first, and thereafter, the Au plating is applied thereto.

Next, the support base member (Cu) used as a temporary substrate is removed. Wet etching using an aqueous ferric chloride solution, aqueous copper chloride solution or the like is used to selectively remove the support base member (Cu) by etching with respect to the exposed pads P1, the wiring layer 14 (the Au plated layer is formed on the surface layer portion thereof), the insulating layer 12 and the solder resist layer 15, for example. In a case where there is a portion on the wiring layer 14, where the Cu surface layer is exposed, a protection film for etching is formed.

Through the aforementioned processes, the structure including the wiring layer 11, the insulating layer 12, the vias 13, the wiring layer 14 and the solder resist layer 15 is formed.

Next, in the same manner as the aforementioned processing, the insulating layer 16, the vias 17, the wiring layer 18 and the solder resist layer 19 are sequentially formed on the surface of the structure where the wiring layer 11 is formed. Then, the solder balls 20 are bonded to the pads P2 by reflow soldering, the pads P2 exposed from the solder resist layer 19. Thus, the package 10 (FIG. 1) of the embodiment is fabricated.

As described above, according to the multilayer wiring board (package) 10 of the embodiment, the land size of each of the lands L1, L2 and L3 (land with a side surface formed in a tapered shape) to be formed on the inner wiring layer 11 is appropriately changed in accordance with the directions in which the vias 13 and 17 to be connected to the lands are formed.

Specifically, as described in relation to FIGS. 2A to 2C, among the first lands L1 and L2 and the second land L3, the size of the land L3 (second land) to which the via 17 is connected only at the surface on the larger diameter side is changed in such a way that the size Db3 of the surface on the side (lager diameter side) to which the via 17 is connected becomes equal to the size Ds3 (=Ds1, Ds2) of the smaller diameter side surface, which is the minimum required size for ensuring the connection reliability of the via. Thus, the size Db3 of the lager diameter side surface of the land L3 is reduced to the size Ds3 of the smaller diameter side. Thus, the size Ds3 of the smaller diameter side surface of the land L3 is also reduced accordingly to the size reduced with a ratio in accordance with the tapered shape.

Thus the size of a specific land L3 (second land) can be reduced, so that the area of the second land can be reduced on the wiring layer 11. Accordingly, the area obtained as a result of reducing the area of the second land can be used as a region to form wiring. Thus, an improvement in the wiring density can be achieved.

Incidentally, approximately 13% of the area of the land can be reduced in a package 10 with a size of 10 mm×10 mm in a case where the size of each of the lands L1, L2 and L3 (larger diameter side) is set equal to 150 μm, and a taper portion equal to 5 μm on one side is generated (i.e., the size of the smaller diameter side is 140 μm, so that a difference of 10 μm occurs between the smaller diameter side and the larger diameter side). As a result, the area usable for wiring increases by approximately 0.3 to 1%.

Moreover, the arrangement pitch of the vias can be reduced by 10 μm. For example, in a case where the wiring width/wiring interval is designed to be equal to 30 μm/30 μm with the same land diameter, the pitch requiring 240 μm (=150+90) as the standard can be reduced to a pitch of 230 μm (=140+90). When considered in the package unit, the effect of reducing the area is not very large, but the effect of reducing the pitch of the vias is considered to be large.

Furthermore, in the embodiment, since the inner wiring layer 11 is formed thicker than the other wiring layers (wiring layers 14 and 18 formed respectively on the insulating layers 12 and 16), a taper difference (difference between land diameters of the larger diameter side and the smaller diameter side) of each of the lands L1, L2 and L3 to be formed in the wiring layer 11 becomes relatively large. Such a configuration achieves a further reduction in the required land diameter (=D) of the second land (land L3 of FIG. 2C), which is the target for the aforementioned change in land size. Thus, the configuration contributes to an improvement in the wiring density.

In addition, in considering that the multilayer wiring board (package) 10 of this embodiment uses the coreless substrate as the base member, formation of the inner wiring layer 11 to have a large thickness can cause the wiring layer 11 to function as part of a reinforcing member of the package 10. Incidentally, the insulating layers 12 and 16 each using a prepreg for increasing the strength of the structure as described above also serves a role as a reinforcing member of the package 10.

In the aforementioned embodiment, there is described an example of the case where the semiconductor element (chip) 1 is mounted on the smaller diameter side (upper side in the example of FIG. 1) of the lands L1, L2 and L3 provided in the inner wiring layer 11 in the multilayer wiring board (package) 10. It is of course, however, that the manner of mounting the chip 1 is not restricted to the example illustrated in FIG. 1. For example, the chip 1 may be mounted on the opposite side, i.e., on the larger diameter side of the lands L1, L2 and L3.

FIG. 3 illustrates an example of the case. In this case, the electrode terminals 2 of the chip 1 are flip-chip bonded via solder bumps or the like to the pads P2 exposed from the solder resist layer 19 on the larger diameter side (upper side in the example of FIG. 3) of the lands L1, L2 and L3 provided in the inner wiring layer 11 in the multilayer wiring board (package) 10a. On the other hand, the external connection terminals (solder balls 20) are bonded to the pads P1 exposed from the solder resist layer 15 on the smaller diameter side (lower side in the example of FIG. 3) of the lands L1, L2 and L3.

As illustrated in FIG. 3, where the chip 1 is mounted on the surface of the package 10a on the larger diameter side (upper side in the illustrated example) of the lands L1, L2 and L3 provided in the inner wiring layer 11, the effect of a further reduction in the land size, i.e., an improvement in the wiring density can be expected. Specifically, the number of vias formed from the mounting surface of the semiconductor element to the inner layer is generally larger than the number of vias formed from the bonding surface of the external connection terminals to the inner layer. Thus, the number of specific lands L3 (lands to which the vias 17 are connected only to the surfaces on the larger diameter side) also becomes large. When the number of lands L3 increases, a further reduction in the land area, i.e., an improvement in the wiring density can be achieved.

In addition, in the aforementioned embodiments, there is described an example of the case where the first lands L1 and L2 and the second land L3 defined on the wiring layer 11 are each formed in a "circular shape." However, the shape of the lands is not necessarily limited to a circular shape as a matter of course. Basically, it is sufficient if the shape is selected so that the length of the shortest line among straight lines each connecting the outer circumferences of the first land and passing through the center of the first land (refer to as "A") can be the same as the length of the shortest line among straight lines each connecting the outer circumferences of the second land and passing through the center of the second land (refer to as "B") A=B). As long as the shape satisfies such a condition (A=B), the shape is not limited to a circular, rectangular or polygonal shape, and the invention can be applied in the same manner.

For example, in a case where the first land is formed in a circular shape while the second land is formed in a rectangular shape, the second land may be formed to have one side equal to the diameter of the smaller diameter side of the first land.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A multilayer wiring board comprising: an inner wiring layer including lands and wiring portions; a first insulating layer formed of a single layer, and formed to an upper face of the inner wiring layer; a second insulating layer formed of a single layer, and formed to a lower face of the inner wiring layer, wherein the inner wiring layer is put between the first insulating layer and the second insulating layer, respectively, wherein the lands protrude from an upper face of the second insulating layer upward; a plurality of vias formed in the first insulating layer and the second insulating layer, respectively; wiring layers formed on the first insulating layer and under the second insulating layer, respectively, and connected to the inner wiring layer through the vias; and the lands, each defined in the inner wiring layer at a position to be connected to at least one of the vias, each of the lands having side surfaces formed in a tapered shape, an upper face having a smaller diameter and a lower face having a larger diameter which is larger than the smaller diameter, and the first insulating layer covers the upper face of the smaller diameter side of the lands and the side surfaces having the tapered shape, and the second insulating layer covers the lower face of the larger diameter side of the lands, wherein the lands include a first land in which a via of the vias is connected to the upper face of the first land and another via of the vias is connected to the lower face of the first land, respectively, and a second land in which a via of the vias is connected to the lower face of the second land, and no via is arranged on the upper face of the second land, and each lower face of the first land and the second land, having a larger diameter, faces to the same direction, and a semiconductor element is to be mounted to a lower side of the second insulating layer, and an external connection terminal is to be provided to an upper side of the first insulating layer, and a number of the vias formed in the second insulating layer is larger than a number of the vias formed in the first insulating layer, and each side surface of each of the vias has a taper shape so that a diameter of the vias decreases gradually toward a respective land, wherein a size of the lower face of the larger diameter side of the second land is equal to a size of the upper face of the smaller diameter side of the first land.

2. The multilayer wiring board according to claim 1, wherein the first insulating layer and the second insulating layer are formed of prepreg.

3. The multilayer wiring board according to claim 2, wherein the inner wiring layer is formed thicker than the wiring layers formed on the first insulating layer and under the second insulating layer, respectively.

4. A multilayer wiring board comprising: an inner wiring layer including lands and wiring portions; a first insulating layer formed of a single layer, and formed to an upper face of the inner wiring layer; a second insulating layer formed of a single layer, and formed to a lower face of the inner wiring layer, wherein the inner wiring layer is put between the first insulating layer and the second insulating layer, respectively, wherein the lands protrude from an upper face of the second insulating layer upward; a plurality of vias formed in the first insulating layer and the second insulating layer, respectively; wiring layers formed on the first insulating layer and under the second insulating layer, respectively, and connected to the inner wiring layer through the vias; and the lands, each defined in the inner wiring layer at a position to be connected to at least one of the vias, each of the lands having side surfaces formed in a tapered shape, an upper face having a smaller diameter and a lower face having a larger diameter which is larger than the smaller diameter, and the first insulating layer covers the upper face of the smaller diameter side of the lands and the side surfaces having the tapered shape, and the second insulating layer covers the lower face of the larger diameter side of the lands, wherein the lands include a first land in which a via of the vias is connected to the upper face of the first land and another via of the vias is connected to the lower face of the first land, respectively, and a second land in which a via of the vias is connected to the lower face of the second land, and no via is arranged on the upper face of the second land, and each lower face of the first land and the second land, having a larger diameter, faces to the same direction, and a semiconductor element is to be mounted to a lower side of the second insulating layer, and an external connection terminal is to be provided to an upper side of the first insulating layer, and a number of the vias formed in the second insulating layer is larger than a number of the vias formed in the first insulating layer, and each side surface of each of the vias has a taper shape so that a diameter of the vias decreases gradually toward a respective land, wherein a size of the lower face of the larger diameter side of the first land is larger than a size of the lower face of the larger diameter side of the second land.

* * * * *